United States Patent [19]

Shirahata

[11] Patent Number: 5,626,677
[45] Date of Patent: May 6, 1997

[54] ATMOSPHERIC PRESSURE CVD APPARATUS

[75] Inventor: Kazuhiro Shirahata, Yamagata, Japan

[73] Assignee: NEC Corporation, Japan

[21] Appl. No.: 636,237

[22] Filed: Apr. 23, 1996

[30] Foreign Application Priority Data

Apr. 27, 1995 [JP] Japan .................................. 7-103749

[51] Int. Cl.⁶ ................................................ C23C 16/00
[52] U.S. Cl. .......................... 118/719; 118/725; 118/729; 156/345
[58] Field of Search ..................... 118/719, 725, 118/729; 156/345

[56] References Cited

FOREIGN PATENT DOCUMENTS 61-173133  10/1986  Japan .

OTHER PUBLICATIONS

M. Yoshida, et al., "Edge Eliminated Head", IEEE Transactions on Magnetics, vol. 29, No. 6, Nov. 1993, pp. 3837–3839.

Primary Examiner—Richard Bueker
Attorney, Agent, or Firm—Ostrolenk, Faber, Gerb & Soffen, LLP

[57] ABSTRACT

An atmospheric pressure CVD apparatus includes an upper convey mechanism, a lower convey mechanism, a loader susceptor up mechanism, and a loader susceptor down mechanism. The upper convey mechanism horizontally conveys a susceptor to be mounted with a semiconductor wafer, and has a wafer loader mechanism, an upper rail, an upper susceptor driving portion, a heater, a dispersion head, and a wafer unloader mechanism. The lower convey mechanism is arranged below the upper convey mechanism to horizontally convey the susceptor, and has a first lower rail, a first lower susceptor driving portion, a plasma reaction portion, a second lower rail, and a second lower susceptor driving portion. The loader susceptor up mechanism moves up and conveys the susceptor from the lower convey mechanism to the upper convey mechanism. The loader susceptor down mechanism moves down and conveys the susceptor from the upper convey mechanism to the lower convey mechanism.

5 Claims, 2 Drawing Sheets

ATMOSPHERIC PRESSURE CVD APPARATUS

BACKGROUND OF THE INVENTION

The present invention relates to an atmospheric pressure CVD (Chemical Vapor Deposition) apparatus for cleaning a susceptor for mounting a semiconductor wafer to be processed thereon.

Generally, in an atmospheric pressure CVD apparatus, a heater is set below a susceptor placing a semiconductor wafer thereon. After the semiconductor wafer is heated to a predetermined temperature, a reaction gas blown from a dispersion head set at an upper portion hits the surface of the semiconductor wafer to form a predetermined thin film thereon.

At this time, the thin CVD film is naturally deposited on the exposed surface portion of the upper surface of the susceptor supporting the semiconductor wafer, other than a surface portion mounting the semiconductor wafer thereon. Particles on the film surface become rough with an increase in number of times of CVD processing, and the thin film formed on this susceptor is easily peeled off. The peeled dust attaches to the surface of the semiconductor wafer, producing a defective semiconductor wafer.

When the thin film deposited on the susceptor has a thickness of 20 to 30 µm, this susceptor is exchanged for a cleaned susceptor. However, exchange of the large, high-temperature susceptor must be avoided in consideration of the safety of an operator.

For this reason, this exchange is performed after the heater of the atmospheric pressure CVD apparatus is turned off to cool down the susceptor to almost room temperature. The waiting period for this temperature drop is about 5 to 6 hours, and temperature rise requires a temperature rise period of about 1 hour due to use of the heater. During these waiting periods, the atmospheric pressure CVD apparatus cannot be used. For this reason, the apparatus downtime is about 50 hours per month, decreasing the operating efficiency by about 7%.

Japanese Utility Model Laid-Open No. 61-173133 discloses the prior art of cleaning a susceptor while eliminating wasteful waiting periods for temperature drop and temperature rise, as shown in FIG. 3.

Referring to FIG. 3, an endless belt 45 on which a large number of susceptors 63 are fixed and arrayed at a predetermined interval is reciprocatively, endlessly rotated by a plurality of pulleys 46 rotating in directions indicated by arrows. A semiconductor wafer (not shown) is supplied onto each susceptor 63 at a start point 71 of an upper forward path 41. A reaction gas 43A blown from a dispersion head 43 hits the semiconductor wafer heated by a heater 47 to form a predetermined thin film on the surface of the semiconductor wafer. This semiconductor wafer is removed from the susceptor 63 at an end point 72 of the forward path.

The susceptor 63 from which the semiconductor wafer is removed is cleaned through a lower return path 42, together with the endless belt 45 on which the susceptor 63 is fixed. In this cleaning operation, the susceptor 63 passes through an etching bath 48 coupled with a filter 51 and a pump 52 to remove the thin film grown on the surface of the susceptor 63 with an etching solution 49, such as hydrofluoric acid, filled in the etching bath 48. Then, the susceptor 63 passes through a water-cleaning bath 54 coupled with a pure-water inlet pipe 53 and having an overflow drain port 56 and cleaned with pure water 55 filled in the bath. The susceptor 63 is dried by a hot-air fan 57, then returns to the forward path 41, and is supplied with a new semiconductor wafer at the start point.

According to this method, the waiting periods for temperature drop and temperature rise to exchange a cleaned susceptor can be eliminated.

In the system of rotating the endless belt 45 on which the susceptors 63 are fixed, however, since the endless belt 45 itself serving as a means for moving the susceptors 63 is inevitably etched in etching for cleaning the susceptors 63, the material and the like of the endless belt 45 must be taken into special consideration. In addition, since the endless belt 45 is constituted by physically connecting rigid members so as to form a chain, the exchange operation and the like become difficult.

When one or a plurality of damaged susceptors 63 fixed to the endless belt 45 are to be exchanged, rotation of the endless belt 45 must be stopped, the damaged susceptors 63 must be dismounted from the endless belt 45, and then new susceptors must be attached and fixed, resulting in cumbersome maintenance.

As shown in FIG. 3, use of wet etching requires the etching bath 48, the water-cleaning bath 54, and the hot-air fan 57 serving as a drying means, increasing the size of the whole apparatus. On the other hand, if the apparatus is downsized to avoid this increase in size, the moving speed of the endless belt 45 must be decreased to perform etching, cleaning with water, and drying for a required period, decreasing the operating efficiency by CVD. In wet etching using this endless belt 45, since the etching solution enters the chain mechanism of the endless belt 45 cannot be removed by cleaning with water, this etching solution adversely affects subsequent formation of a thin CVD film.

SUMMARY OF THE INVENTION

It is an object of the present invention to provide an atmospheric pressure CVD apparatus capable of cleaning susceptors without stopping the operation of the apparatus.

It is another object of the present invention to provide an atmospheric pressure CVD apparatus in which a susceptor moving means is not etched in etching for cleaning susceptors, and a damaged susceptor is easily exchanged.

It is still another object of the present invention to provide an atmospheric pressure CVD apparatus capable of efficiently cleaning susceptors without using a large cleaning means.

In order to achieve the above objects, according to the present invention, there is provided an atmospheric pressure CVD apparatus comprising an upper convey mechanism for horizontally conveying a susceptor to be mounted with a semiconductor wafer, the upper convey mechanism having a wafer loader mechanism, an upper rail, an upper susceptor driving portion, a heater, a dispersion head, and a wafer unloader mechanism, a lower convey mechanism arranged below the upper convey mechanism to horizontally convey the susceptor, the lower convey mechanism having a first lower rail, a first lower susceptor driving portion, a plasma reaction portion, a second lower rail, and a second lower susceptor driving portion, a loader susceptor up mechanism for moving up and conveying the susceptor from the lower convey mechanism to the upper convey mechanism, and a loader susceptor down mechanism for moving down and conveying the susceptor from the upper convey mechanism to the lower convey mechanism, wherein, in the upper convey mechanism, the wafer loader mechanism mounts the semiconductor wafer on the susceptor moved up and conveyed from the lower convey mechanism by the loader susceptor up mechanism, the upper susceptor driving portion conveys the susceptor mounted with the semiconductor wafer to the loader susceptor down mechanism along the upper rail, a thin CVD (Chemical Vapor Deposition) film is formed on a surface of the semiconductor wafer heated to a predetermined temperature by the heater, using a reaction gas through the dispersion head in the conveying process, and the wafer unloader mechanism removes the semiconductor wafer on which the thin CVD film is formed, from the susceptor before conveyance to the loader susceptor down mechanism, and in the lower convey mechanism, the first lower susceptor driving portion conveys the susceptor moved down by the loader susceptor down mechanism, to the plasma reaction portion along the first lower rail, the plasma reaction portion cleans the thin CVD film formed on the susceptor, and the second lower susceptor driving portion conveys the cleaned susceptor to the loader susceptor up mechanism along the second lower rail.

DESCRIPTION OF THE PREFERRED EMBODIMENT

Figure 1:
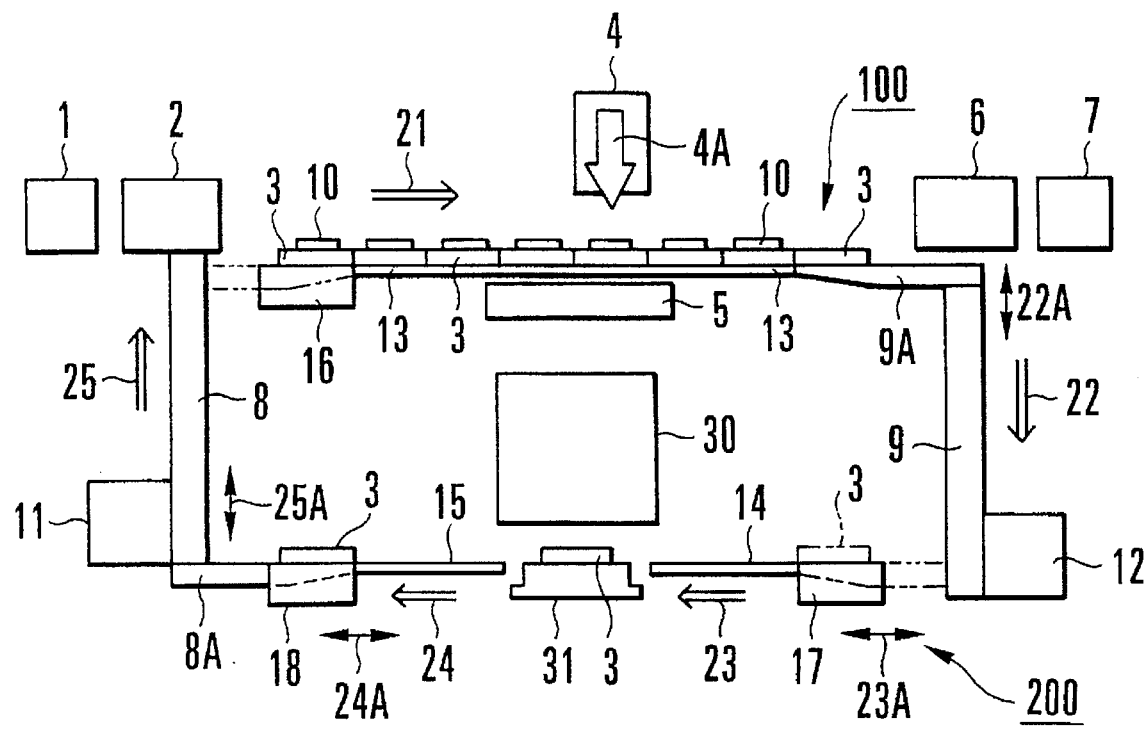
FIG. 1 is a schematic view showing an atmospheric pressure CVD apparatus according to an embodiment of the present invention.

The present invention will be described below with reference to the accompanying drawings. FIG. 1 schematically shows an atmospheric pressure CVD apparatus according to an embodiment of the present invention.

An upper convey mechanism 100 constituted by a loader-side cassette portion 1, a wafer loader mechanism 2, an upper rail 13, an upper susceptor driving portion 16, a heater 5, a dispersion head 4, a wafer unloader mechanism 6, and an unloader-side cassette portion 7 is arranged on the upper side of this apparatus.

A lower convey mechanism 200 constituted by a first lower rail 14, a first lower susceptor driving portion 17, a plasma reaction portion 30 including an up-down stage 31, a second lower rail 15, and a second lower susceptor driving portion 18 is arranged on the lower side of this apparatus.

The upper and lower convey mechanisms 100 and 200 are coupled through a loader susceptor up mechanism 8 including a motor 11 and a support portion 8A and having a screw mechanism, and an unloader susceptor down mechanism 9 including a motor 12 and a support portion 9A and having a screw mechanism.

Semiconductor wafers 10 are mounted from a cassette set at the loader-side cassette portion 1 to susceptors 3 consisting of, e.g., SiC by the wafer loader mechanism 2. The susceptors 3 are conveyed on and along the upper linear rail 13 by the upper susceptor driving portion 16 in a direction indicated by an arrow 21 at a constant speed or intermittently at a constant speed. In this convey operation, the upper susceptor driving portion 16 feeds a next susceptor 3 in contact with the last susceptor 3 on the upper rail 13 to sequentially push the previous susceptor 3. Therefore, as shown in FIG. 1, the susceptors 3 themselves tightly contact each other.

In the convey process, after each semiconductor wafer 10 is heated to a predetermined temperature by the heater 5 through the susceptor 3, a reaction gas 4A is blown from the dispersion head 4 set at an upper portion to form a thin CVD film of, e.g., a silicon oxide film on the surface of the semiconductor wafer 10. At that time, the thin CVD film is undesirably deposited on the exposed surface of the susceptor 3 supporting this semiconductor wafer 10.

The susceptor 3 mounted with the semiconductor wafer 10 on which the predetermined thin CVD film is formed is conveyed in the direction indicated by the arrow 21. The semiconductor wafer 10 is stored from the susceptor 3 in a cassette set at the unloader-side cassette portion 7 by the wafer unloader mechanism 6.

The susceptor 3 from which the semiconductor wafer 10 is removed is conveyed onto the support portion 9A of the unloader susceptor down mechanism 9 which has moved up to a position as high as the upper rail 13. The support portion 9A is moved down upon driving of the motor 12 to convey the susceptor 3 in a direction indicated by an arrow 22, i.e., from the upper convey mechanism 100 to the lower convey mechanism 200.

The susceptor 3 on the support portion 9A which has been moved down to a position as low as the first lower rail 14 is conveyed by the first lower susceptor driving portion 17 along the first linear lower rail 14 in a direction indicated by an arrow 23. The support portion 9A from which the susceptor 3 is removed is moved up to the position of the upper rail 13 upon driving of the motor 12 and waits for conveyance of the next susceptor 3 in the upper direction 22. That is, the susceptor 3 is moved in only the lower direction 22, but the support portion 9A moves in the vertical direction 22A. The susceptor 3 is conveyed by the first lower susceptor driving portion 17 and mounted on the up-down stage 31. The up-down stage 31 moves up to remove the thin CVD film and contamination undesirably deposited on the susceptor 3 in the plasma reaction portion 30, thereby cleaning the susceptor 3.

Note that, since the upper susceptor driving portion 16 conveys the susceptor 3 so as to push the susceptor 3, as described above, the upper susceptor driving portion 16 itself does not move over the entire stroke along the upper rail 13. To the contrary, the first lower susceptor driving portion 17 moves along the first lower rail 14, while supporting the susceptor 3. After the first lower susceptor driving portion 17 mounts the susceptor 3 on the up-down stage 31, the first lower susceptor driving portion 17 returns toward the unloader susceptor down mechanism 9 and waits for conveyance of the next susceptor 3. That is, in the lower convey mechanism 200, the susceptor 3 moves along the first lower rail 14 in only one direction 23, but the first lower susceptor driving portion 17 moves along the first lower rail 14 in a reciprocal direction 23A. As a detailed method of conveying the susceptor 3, the susceptor 3 is mounted on the first lower rail 14 and pushed by the first lower susceptor driving portion 17. Alternatively, the first lower susceptor driving portion 17 grips the susceptor 3 and slides on the first lower rail 14.

Upon completion of predetermined cleaning in the plasma reaction portion 30, the up-down stage 31 moves down to the position of the second lower rail 15 which is as high as the first lower rail 14. The susceptor 3 which is mounted on the up-down stage 31 and has been cleaned is conveyed by the second lower susceptor driving portion 18 along the second linear lower rail 15 in a direction indicated by an arrow 24. Then, the susceptor 3 is mounted on the support portion 8A of the loader susceptor up mechanism 8 which has moved to the position of the second lower rail 15. The second lower susceptor driving portion 18 returns toward the up-down stage 31 and waits for conveyance of the next cleaned susceptor 3. That is, the second lower susceptor driving portion 18 moves along the second lower rail 15 in a reciprocal direction 24A, as well as the first lower susceptor driving portion 17. As a method of conveying the susceptor 3, the susceptor 3 is mounted on the second lower rail 15 and pushed away by the second lower susceptor driving portion 18. Alternatively, the second lower susceptor driving portion 18 grips the susceptor 3 and slides on the second lower rail 15.

The support portion 8A of the loader susceptor up mechanism 8 on which the susceptor 3 is placed moves up to the position of the upper rail 13 of the upper convey mechanism 100 upon driving of the motor 11. The semiconductor wafer 10 subjected to the CVD processing is mounted on this cleaned susceptor 3 again and conveyed by the upper susceptor driving portion 16 again in the direction indicated by the arrow 21. The support portion 8A from which the susceptor 3 is removed moves down to the position of the second lower rail 15 upon driving of the motor 11 and waits for upward conveyance of the next, cleaned susceptor 3. That is, in the loader susceptor up mechanism 8, the susceptor 3 moves in only an upper direction 25, but the support portion 8A moves in a vertical direction 25A. All the operations and processes are automatically performed except for maintenance such as exchange of a damaged susceptor.

Figure 2:
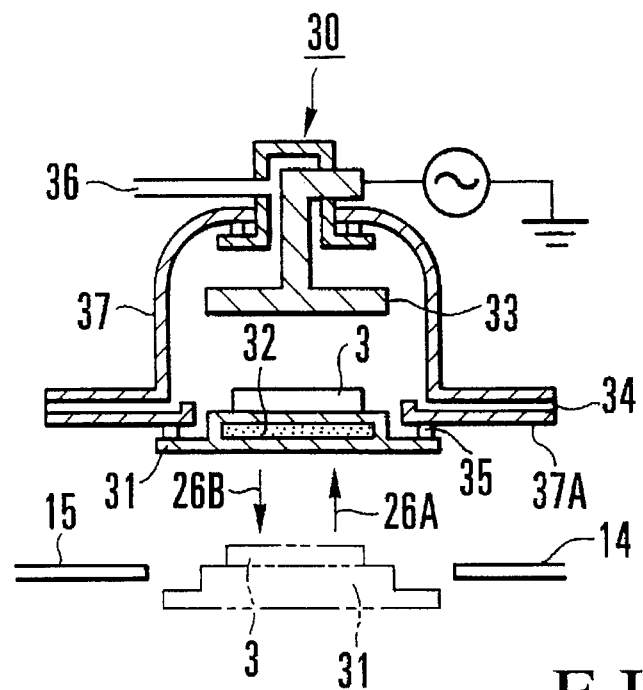
FIG. 2 is a sectional view showing a plasma reaction portion in the atmospheric pressure CVD apparatus according to the embodiment of the present invention.
Figure 3:
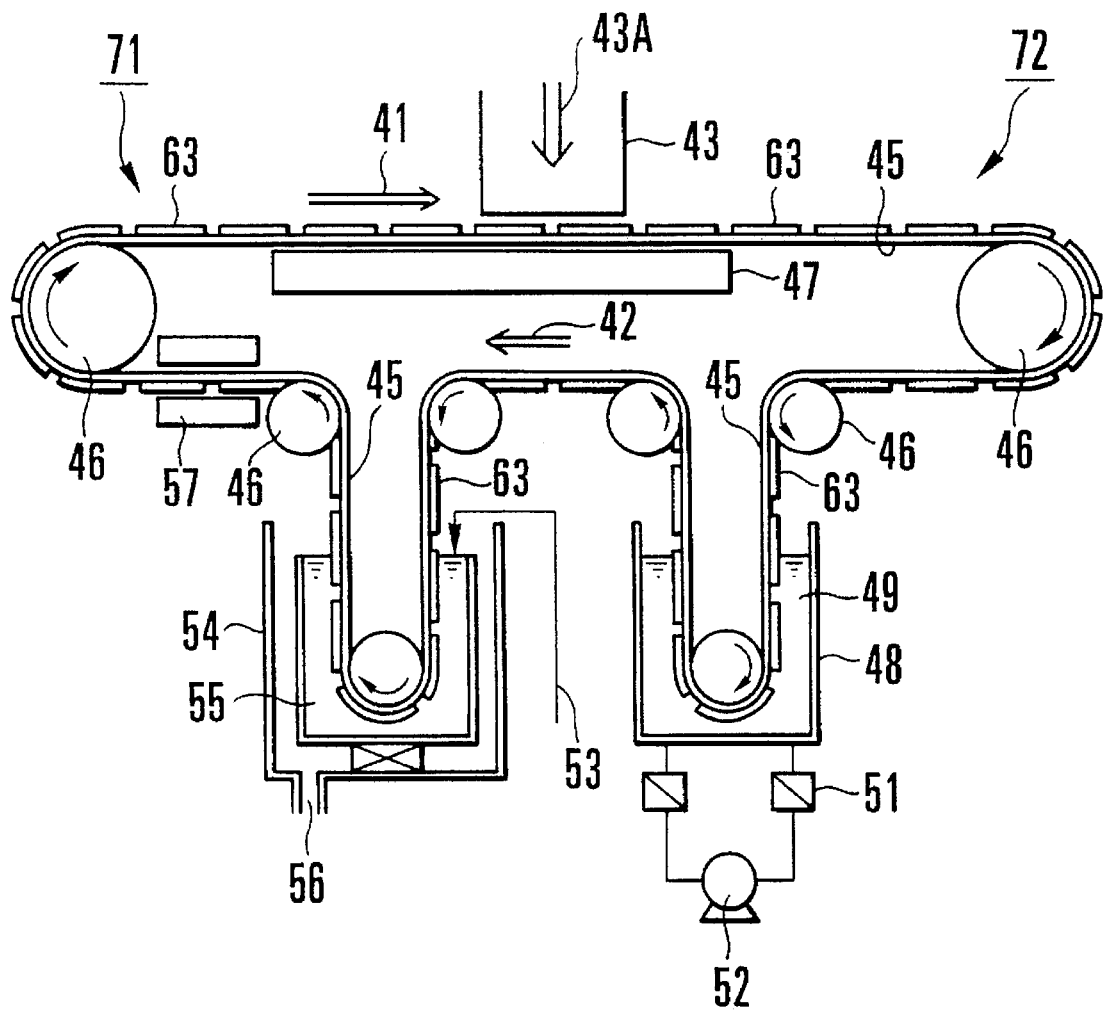
FIG. 3 is a view showing an atmospheric pressure CVD apparatus of a prior art.

Next, with reference to FIG. 2, the plasma reaction portion 30 of this embodiment will be described. The up-down stage 31 mounting the contaminated susceptor 3 conveyed along the first lower rail 14 moves in an upper direction 26A and abuts against a flange portion 37A of a plasma reaction chamber 37 through an O-ring 35. The susceptor 3 incorporated in the up-down stage 31 is heated to a predetermined temperature. The interior of the plasma reaction chamber 37 which is airtightly sealed by abutment of the up-down stage 31 is evacuated through an evacuation port 34. An etching gas, e.g., a gas mixture of $CF_4$, $N_2O$, and $SiH_4$, or a gas mixture of $SF_4$ and oxygen is introduced through an etching gas inlet port 36. An RF power is supplied to an electrode 33 to generate a plasma, thereby etching and removing the thin CVD film and contamination undesirably deposited on the susceptor 3, and cleaning the susceptor 3.

Upon completion of this plasma etching, the up-down stage 31 moves in a lower direction 26B and conveys the cleaned susceptor 3 onto the second lower rail 15.

As has been described above, according to the present invention, since the susceptor can be cleaned without turning off the heater for a thin CVD film, a decrease in operating efficiency of the apparatus can be avoided. In addition, the susceptor convey means of the present invention is not an endless belt on which susceptors are fixed, and is not exposed in an etching atmosphere and the like in etching for cleaning susceptors. Therefore, the material and the like of the susceptor convey means can be freely set regardless of etching conditions for cleaning; susceptors. Since the susceptors are not fixed to the susceptor convey means of the present invention, exchange of a damaged susceptor is facilitated, and maintenance is simplified. Since the convey means is constituted by separate parts, maintenance of the convey means itself is facilitated.

Further, since a plasma reaction is used for cleaning, in place of wet etching, the apparatus becomes compact compared to the case of wet etching, and the cleaning operation can be performed within a short period of time. Since the up-down stage is used which is vertically driven while placing the susceptor thereon, and airtightly seals the plasma reaction chamber, the apparatus becomes more compact, and the cleaning operation including conveyance is more efficiently performed.

What is claimed is:

1. An atmospheric pressure CVD apparatus comprising:

an upper convey mechanism for horizontally conveying a susceptor to be mounted with a semiconductor wafer, said upper convey mechanism having a wafer loader mechanism, an upper rail, an upper susceptor driving portion, a heater, a dispersion head, and a wafer unloader mechanism;

a lower convey mechanism arranged below said upper convey mechanism to horizontally convey said susceptor, said lower convey mechanism having a first lower rail, a first lower susceptor driving portion, a plasma reaction portion, a second lower rail, and a second lower susceptor driving portion;

a loader susceptor up mechanism for moving up and conveying said susceptor from said lower convey mechanism to said upper convey mechanism; and a loader susceptor down mechanism for moving down and conveying said susceptor from said upper convey mechanism to said lower convey mechanism, and wherein, in said upper convey mechanism, said wafer loader mechanism mounts said semiconductor wafer on said susceptor moved up and conveyed from said lower convey mechanism by said loader susceptor up mechanism, said upper susceptor driving portion conveys said susceptor mounted with said semiconductor wafer to said loader susceptor down mechanism along said upper rail, a thin CVD (Chemical Vapor Deposition) film is formed on a surface of said semiconductor wafer heated to a predetermined temperature by said heater, using a reaction gas through said dispersion head in the conveying process, and said wafer unloader mechanism removes said semiconductor wafer on which the thin CVD film is formed, from said susceptor before conveyance to said loader susceptor down mechanism; and in said lower convey mechanism, said first lower susceptor driving portion conveys said susceptor moved down by said loader susceptor down mechanism, to said plasma reaction portion along said first lower rail, said plasma reaction portion cleans the thin CVD film formed on said susceptor, and said second lower susceptor driving portion conveys said cleaned susceptor to said loader susceptor up mechanism along said second lower rail.

2. An apparatus according to claim 1, wherein said plasma reaction portion comprises a vertically movable up-down stage moves on which said susceptor is mounted, and a plasma reaction chamber for generating a plasma to clean said susceptor, while said plasma reaction chamber is airtightly sealed by said up-down stage which has been moved up, and said up-down stage mounts said susceptor conveyed from said first lower rail to move up, and moves down upon completion of cleaning said susceptor to convey said susceptor to said second lower rail.

3. An apparatus according to claim 1, wherein said loader susceptor up mechanism and said loader susceptor down mechanism comprise support portions for supporting said susceptor, and motors for moving up/down said support portions.

4. An apparatus according to claim 1, wherein said upper susceptor driving portion pushes said susceptor to progressively convey coupled susceptors during conveyance, and said first and second lower susceptor driving portions separately support and convey said susceptors.

5. An apparatus according to claim 1, wherein said upper and lower convey mechanisms convey said susceptor in directions opposite to each other.

* * * * *